United States Patent [19]

Schoeff

[11] 3,894,290

[45] July 8, 1975

[54] BALANCED DOUBLE-TO-SINGLE-ENDED CONVERTER STAGE FOR USE WITH A DIFFERENTIAL AMPLIFIER

[75] Inventor: John A. Schoeff, Mesa, Arz.

[73] Assignee: Motorola, Inc., Chicago, Ill.

[22] Filed: June 15, 1973

[21] Appl. No.: 370,518

[52] U.S. Cl. .................. 330/14; 330/22; 330/30 D; 330/69

[51] Int. Cl. .............................................. H03f 3/04

[58] Field of Search ................ 330/14, 30 D, 69, 22

[56] References Cited

UNITED STATES PATENTS 3,760,288 9/1973 Leonard.......................... 330/30 D

*Primary Examiner*—R. V. Rolinec
*Assistant Examiner*—Lawrence J. Dahl
*Attorney, Agent, or Firm*—Vincent J. Rauner; Maurice J. Jones, Jr.

[57] ABSTRACT

A converter circuit for transforming balanced signals into an unbalanced output signal is disclosed. First and second active loads each of which are connected between one of the output terminals of a balanced source, such as a differential amplifier, and a voltage supply are included in the converter circuit. The loads clamp each of the output terminals of the differential amplifier to a predetermined voltage level. A third active load interconnects the balanced loads with each other, provides current regulation for the differential amplifier and facilitates a "turn-around" function which enables each of the balanced output signals of the differential amplifier to at all times contribute to the unbalanced output signal.

19 Claims, 2 Drawing Figures

BALANCED DOUBLE-TO-SINGLE-ENDED CONVERTER STAGE FOR USE WITH A DIFFERENTIAL AMPLIFIER

CROSS REFERENCE TO RELATED APPLICATIONS

The subject matter of the present application is related to the subject matter of the patent application entitled "Dual Ramp Analog-to-Digital Converter Having a Monolithic Analog Subsystem," Ser. No. 370,519 and of the patent application entitled "Low Hysteresis Threshold Detector Having Controlled Output Slew Rate," Ser. No. 370,517, which were filed on even date herewith by the present inventor and assigned to the same assignee.

BACKGROUND OF THE INVENTION

The need frequently arises for multistage amplifiers capable of amplifying signals having direct current (D.C.) and other low-frequency components which have magnitudes that change slowly as a function of time. For instance, dual ramp analog-to-digital converters require such amplifiers. Because of the low time rate of change of signal amplitude, capacitors of practical size cannot be used in such amplifiers for either coupling or bypass, and transformers are also generally unsuitable for providing coupling and isolation. As a result, one amplifier stage is generally directly connected or coupled to the amplifier input terminal and the output terminal of each amplifier stage is directly connected or coupled to the input terminal of a subsequent stage. Thus, the bias currents in each stage may not be separable from the signal currents. The design of such direct coupled (D-C) amplifiers presents special problems because of restricted freedom in the choice of bias potentials and techniques. Transistorized D-C amplifiers present particularly difficult problems as compared to tube-type D-C amplifiers because thermal currents may be amplified therein along with signal currents.

Differential amplifier configurations which each include at least one pair of differentially connected transistors have been advantageously employed in transistorized D-C amplifiers. One advantage of the differential amplifier in such D-C applications is that under ideal conditions common mode input signals do not effect the output signal. More specifically, any signal which causes the collector currents of both differentially connected transistors to increase or decrease equally and simultaneously will have no affect on the output voltage which is developed between the collectors of the differentially connected transistors. Therefore, changes in the collector-junction leakage current with the emitter open ($I_{CO}$) and in the base-to-emitter voltage ($V_{BE}$) with temperature variation do not affect the output voltage magnitude, provided that the differentially connected transistors have matched characteristics and are maintained at the same temperature. Thus, thermal currents are balanced out rather than passed on to the next stage.

Differential amplifier configurations are particularly useful in integrated circuit, D-C amplifiers. The increase in the number of components required by the differential amplifier configuration as compared with other D-C amplifier circuits does not cause a proportional increase in price of monolithic structures. In addition, active components are relatively easy and inexpensive to fabricate in monolithic form as compared to passive components which must be held to a minimum. Closely matched components are readily achievable in monolithic circuits because all components on each wafer are processed simultaneously. Also critical parts can be placed in close spacial proximity to assure substantially equal temperatures. Finally, the need to avoid the fabrication of capacitors wherever possible in integrated circuits makes D-C differential amplifier circuits the best solution to many problems. The differential amplifier circuit is being used as the basic circuit for many wide-band linear amplifiers which amplify signals having frequency components ranging from D.C. to high frequency.

Balanced differential amplifiers are suitable for amplifying input signals from symmetrical signal sources such as strain gages, bridge circuits, and balanced transmission lines, each of which provides a balanced signal which is not referenced to ground. Unbalanced differential amplifiers are suitable for amplifying input signals which are referenced to ground. The output signals of the balanced and unbalanced differential amplifiers are balanced and may be directly fed only to a balanced load such as another balanced amplifier. In some applications, it is desirable to transform the inherently balanced or double ended output signal of the differential amplifier into a single ended or unbalanced output signal. Prior art circuit configurations for providing double-to-single ended or balanced-to-unbalanced conversion sometimes tend to unbalance the differential amplifier and thereby destroy many of its inherent, desirable characteristics.

More particularly, one common balanced-to-unbalanced converter circuit requires that the base of a PNP transistor be connected to the collector of a first differentially connected transistor and that the base of a NPN transistor be connected to the collector of the second differentially connected transistor. As a result, the base current of the PNP transistor adds to the collector current of the first differentially connected transistor and the base current of the NPN transistor subtracts from the collector current of the second differentially connected transistor. Unless these base currents are made very small, which is usually difficult or impractical, an input offset voltage results across the input terminals of the differential amplifier. Input offset voltage is defined as the difference in base-to-emitter potentials required for equal emitter current in the differential transistors. The resulting current mismatch in the differential transistors which changes as a function of temperature causes the input offset voltage to also vary as a function of temperature. In addition, the amount of collector current mismatch of the differential transistors will vary with changes in the betas of the PNP and NPN transistors which may be mismatched in value and temperature coefficient to cause further undesirable input offset voltage drift.

In the above-mentioned commonly used converter configuration, the emitter of the NPN transistor is generally connected to ground whereas the emitter of the PNP transistor is generally connected to a high supply potential. As a result, the collectors of the differentially connected transistors are held at substantially different quiescent potentials which causes their depletion regions to be of different thicknesses. Hence, the betas of the differentially connected transistors are forced to be unequal by the prior art balanced-to-unbalanced converter. As a result, the self-balancing characteristic of the differential amplifier is defeated to detrimentally affect its common mode rejection ratio (CMRR) which is the ratio of the common mode input voltage magnitude-to-differential mode input voltage magnitude that will yield the same differential mode output voltage. Also, the prior art balanced-to-unbalanced converter causes the collector voltages of the differentially connected transistors to vary unequally with output voltage swing and to track in opposite direction with temperature to thereby introduce further unpredictable errors. Furthermore, this prior art converter circuit tends to allow variations in power supply voltage to introduce an unbalanced signal condition within the differential amplifier which results in an unwanted change in output signal level with power supply voltage variations.

SUMMARY OF THE INVENTION

One object of the invention is to provide an improved direct-coupled amplifier circuit.

Another object of the invention is to provide an improved double-to-single ended converter circuit.

Still another object of the invention is to provide a double-to-single ended converter circuit for a differential amplifier which allows the differential amplifier to retain a high common mode rejection ratio.

A further object of the invention is to provide a double-to-single ended converter which applies collector voltages of substantially equal magnitude to differentially connected transistors.

A still further object of the invention is to provide a double-to-single ended converter which has substantially equal affects on the collector currents of a differential amplifier.

Still another object of the invention is to provide a double-to-single ended converter circuit which tends to isolate the differential transistors from power supply variations.

An additional object of the invention is to provide a double-to-single ended converter circuit which is suitable for being provided in an integrated circuit form.

A still additional object of the invention is to provide a double-to-single ended converter circuit for use with a differential amplifier which enables the current source of the differential amplifier to demand only a small amount of current so that the input current drawn by the differential amplifier is even smaller and does not load the driving source.

In brief, the invention relates to a balanced-to-unbalanced converter circuit which is suitable for transforming a balanced signal at the output of a differential amplifier, for instance, into an unbalanced signal at the converter output terminals and which maintains electrical balance within the differential amplifier. More particularly, the balanced-to-unbalanced converter includes a first active load which is connected between a first terminal of the differential amplifier and a first power supply terminal. The first active load includes a first electron control device which clamps the first output terminal of the differential amplifier to a predetermined voltage level and a first current supply which provides a controlled amount of current to the differential amplifier. Similarly, a second active load is connected between a second terminal of the differential amplifier and the first power supply terminal. The second active load includes a second electron control device which clamps the second output terminal of the differential amplifier to the predetermined voltage and a second current supply which provides a controlled amount of current to the differential amplifier. The second active load has substantially the same configuration as the first active load to maintain voltage and current balance in the differential amplifier. A third circuit which also forms part of the active load interconnects the first and second active loads with each other and the amplifier output terminal and has a configuration which contributes only negligible imbalance to the differential amplifier. Moreover, the third circuit both enables the balanced voltages applied to the first and second active loads to simultaneously control the unbalanced output voltage of the converter and tends to provide current regulation in the amplifier.

DETAILED DESCRIPTION OF THE PREFERRED EMBODIMENT

Figure 1:
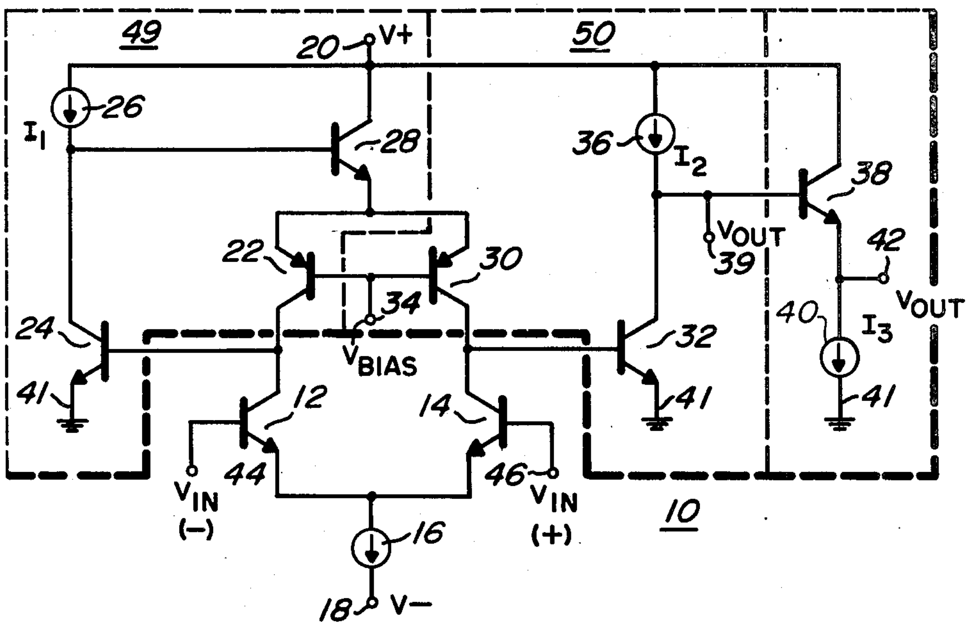
FIG. 1 is a partial schematic and block diagram of a differential amplifier having the double-to-single ended converter stage of one embodiment of the invention.

Differential amplifier circuit 10 of FIG. 1 includes differentially connected electron control means or NPN bipolar transistors 12 and 14 which have their emitters connected through current source 16, which provides a current $I_T$ of a limited magnitude, to power supply terminal 18 which is adapted to apply a negative power supply voltage (V−). The collectors of transistors 12 and 14 provide a balanced signal source and are each connected through active loads to power supply terminal 20, which is adapted to apply a positive power supply voltage (V+). The collector of transistor 12 is connected to the collector of PNP bipolar transistor 22 and to the base of NPN transistor 24. Current source 26, which provides current $I_1$ having a limited magnitude, is connected from positive supply terminal 20 to the collector of transistor 24 and to the base of feedback transistor 28. The collector of transistor 14 is connected to the collector of PNP transistor 30 and to the base of NPN transistor 32.

Terminal 34 which is adapted to receive a bias potential of a magnitude between V+ and V− is connected to the bases of transistors 22 and 30. Current source 36 which provides current $I_2$ having a limited magnitude is connected from power supply terminal 20 to the collector of transistor 32 and to the base of NPN buffer transistor 38. Output terminal 39 is also connected to the base electrode of transistor 38. Current source 40, which provides current $I_3$ of limited magnitude, is connected from the emitter of transistor 38 and terminal 42 to terminal 41, which is adapted to apply a ground or reference potential. The emitters of transistors 24 and 32 may also be connected to terminal 41. If circuit 10 is provided in monolithic form, terminals 18, 20, 34 and 41 may be conductive strips of metalization which are formed in a known manner.

During quiescent operation of circuit 10, the positive voltage applied to terminal 20 renders current sources 26 and 36 operative, and they supply no more than the predetermined amounts of current through their output terminals. Some of the current from current source 26 provides base current for transistor 28 to render it conductive. The current conducted by transistor 28, and the bias voltage applied through terminal 34 render transistors 22 and 30 conductive so that they respectively supply base current for transistors 24 and 32 and collector current for differentially connected transistors 12 and 14.

Transistors 24 and 28 form a feedback loop which tends to control the current flow through transistor 12 in accordance with the setting of the bias potential at terminal 34. If transistor 22 attempts to deliver more than the desired amount of current to transistor 12, transistor 24 tends to be rendered more conductive and thereby pulls the voltage on the base of transistor 28 away from the positive potential. As a result, transistor 28 tends to be rendered nonconductive and conducts less current from terminal 20 to the emitter of transistor 22. Consequently, transistor 22 supplies less current to transistors 12 and 24 and balance is thereby maintained by the negative feedback loop.

To illustrate the dynamic operation of the circuit, assume that a reference potential is applied to negative or inverting input terminal 44, which is connected to the base of transistor 12, and that a positive voltage on the order of a few millivolts above the reference potential is applied to positive or noninverting input terminal 46, which is connected to the base of transistor 14. The positive input voltage turns transistor 14 on which increases the amount of current conducted by transistor 14. This causes a corresponding decrease in the amount of current conducted by transistor 12 since current source 16 will accept no more than the fixed amount of current $I_T$. As transistor 14 is rendered more conductive, its collector voltage drops and, hence, the base voltage of transistor 32 becomes more negative which causes transistor 32 to be less conductive. Consequently, the voltage applied to output terminal 39 and to the base of transistor 38 tends to increase in the positive direction. Thus, transistor 38 is rendered more conductive so that the buffered output voltage level at terminal 42 rises in correspondence to the positive input voltage magnitude at terminal 46.

As the magnitude of the input voltage applied to noninverting input terminal 46 rises, the magnitude of the current through transistor 12 decreases. As transistor 12 becomes less conductive, the voltage at the base of transistor 24 becomes more positive to render transistor 24 more conductive. Thus, the base voltage of transistor 28 drops which causes transistor 28 to be less conductive and to thereby supply less emitter current to transistors 22 and 30. Thus, the current flow through transistor 22 is adjusted to provide a smaller current to transistor 12 and transistor 30 supplies less base current to transistor 32. Therefore, the operation of transistors 12, 22, 24, 28, and 30 also tend to render transistor 32 less conductive to thereby result in an additive increase in the positive voltage at output terminal 39 and at buffered output terminal 42.

In response to the previously defined input signal states, transistor 14 sinks more current from the base of transistor 32 and transistor 30 supplies less current to the base of transistor 32. Thus, the base current of transistor 32 decreases in response to both the decrease in magnitude of the current supplied by transistor 30 and to the increased demand by transistor 14. Thus, the total change of the base current for transistor 32 is greater than if only one of transistors 14 or 30 was connected thereto. The circuit 10 of FIG. 1 provides twice as much change in the current of transistor 32 than it would cause if transistor 30, for instance, was not connected to the base of transistor 32.

Alternatively, if noninverting input terminal 46 is driven negative while a ground or reference potential is applied to inverting input terminal 44, transistor 14 will tend to be rendered less conductive. Consequently, transistor 32 is rendered more conductive and transistor 38 is rendered less conductive so that the voltages at terminals 39 and 42 tend to decrease. Also, the resulting increased current through transistor 12 causes transistor 24 to be rendered less conductive. Consequently, transistor 28 is rendered more conductive and thereby increases the current flow through transistor 30 to further increase the conductivity of transistor 32 to further lower the output voltage magnitude at terminals 39 and 42. Thus, the magnitudes of the output voltages follow the magnitude of the input voltage applied to terminal 46. Therefore, input terminal 46 is generally called the noninverting input terminal of the amplifier.

On the other hand, if the reference potential is connected to terminal 46 and the amplitude of the input voltage at inverting terminal 44 is decreased, transistor 12 is rendered less conductive and transistor 14 is rendered more conductive to cause a corresponding rise in the magnitudes of the output voltages. If the magnitude of the input voltage at terminal 44 is increased, the magnitudes of the output voltages decrease. Thus, input terminal 44 is called the inverting input of amplifier 10.

If a balanced, differential signal is applied between input terminals 44 and 46 then terminal 46 is driven positive as terminal 44 is driven negative, and terminal 46 is driven negative as terminal 44 is driven positive. A positive rise at terminal 46 and the negative drop at terminal 44 both cooperate to cause the magnitude of the output voltage to increase in a positive direction. Alternatively, a negative going input voltage at terminal 46 and a positive going input voltage at terminal 44 both cooperate to cause the magnitude of the output voltage to move in the negative direction. Thus, the circuit of FIG. 1 is suitable for: amplifying a single ended input signal applied between terminal 46 and ground, amplifying and inverting a single ended input terminal applied between ground and terminal 44, and amplifying a double ended or differential signal developed between terminals 44 and 46. In all cases, the output signal developed between either of output terminals 39 or 42 and the reference potential is of a single ended or unbalanced nature since it is referenced to ground.

The magnitude of the output voltage at terminal 42 follows the magnitude of the output voltage at terminal 39. The buffer stage including transistor 38 and current source 40 could be deleted for all applications except those requiring a high degree of balance. More specifically, the thermal current and voltage changes with temperature variation of NPN transistor 28 are attenuated and applied through the high impedance of the reverse biased collector-to-base junction of transistor 24 to the collector of transistor 12. Similarly, the thermal current and voltage changes with temperature variation of NPN transistor 38 are attenuated and applied through the high impedance of the reverse biased collector-to-base junction of transistor 32 to the collector of transistor 14. As a result, the thermal current and voltage changes of transistors 28 and 38 tend to balance each other out and result in virtually no net output voltage. Even without transistor 38 in the circuit, the imbalance caused by transistor 28 would be insignificant in many applications.

If transistor 38 is not included in the circuit of FIG. 1, then the active load of transistor 12 may be considered to include transistor 24 and current source 26, and the active load for transistor 14 may be considered to include transistor 32 and current source 36. Transistors 22, 28 and 30 may be considered as a "turn-around" circuit for intercoupling the active load of transistor 12 through the active load of transistor 14 to converter output terminal 39.

If transistor 38 is included in the circuit of FIG. 1, transistors 22, 24, and 28 and first current supply 26 may be considered to form the active load 49 for differential transistor 12. Similarly, transistors 30, 32, and 38 and second current supply 36 may be considered to form an active load 50 for differential transistor 14. As previously pointed out, active loads 49 and 50 form a double-to-single ended converter for the differential amplifier including transistors 12 and 14. Since loads 49 and 50 are substantially symmetrical in configuration, they tend to cause common mode changes at the collectors of transistors 12 and 14 with temperature change and with voltage supply variations at terminal 20. These changes tend to be balanced out by the differential operating action of transistors 12 and 14 and the action of the converter circuit so that they do not undesirably affect the output voltage.

More specifically, transistor 24 tends to hold or clamp the collector of transistor 12 at one diode drop above the reference potential and transistor 32 tends to hold the collector of transistor 14 at one diode drop above the reference potential. Thus, the collector potentials on transistors 12 and 14 are made equal to each other. Some prior art double-to-single ended converters tend to cause different collector voltages on the differential transistors associated therewith which results in beta mismatch and an undesirable decrease of the common mode rejection ratio of the differential amplifier.

Moreover, if the temperature of the chip increases, the change in the base-to-emitter voltages and the saturation currents of the transistors of active loads 49 and 50 tend to have respectively the same affect on the collectors of transistors 12 and 14 so that they are in effect balanced out. More particularly, assuming that transistors 24 and 32 are located in close spacial proximity in a monolithic structure, if the base-to-emitter voltage of transistor 24 increases due to temperature decrease, the base-to-emitter voltage of transistor 32 likewise increases. Hence, the collector voltages of transistors 12 and 14 will be increased by the same amount so that the betas of transistors 12 and 14 also tend to increase by the same amount so as to not cause input offset voltages or current drift with temperature change. A change in the power supply voltage developed at terminal 20, due to ripple, for instance, will also cause the same affect at the collector of transistor 12 as it causes at the collector of transistor 14. A change in the voltage at the collector of transistor 12 tends to pull the converter output voltage in the opposite direction than the same change in the voltage at the collector of transistor 14 tends to cause. Thus, equal changes at the collectors of transistors 12 and 14 tend to be cancelled at the converter output terminal. Thus, the common mode rejection capability of the amplifier and the action of the converter both tend to balance out variations that otherwise could cause the magnitude of the output voltage to vary.

Figure 2:
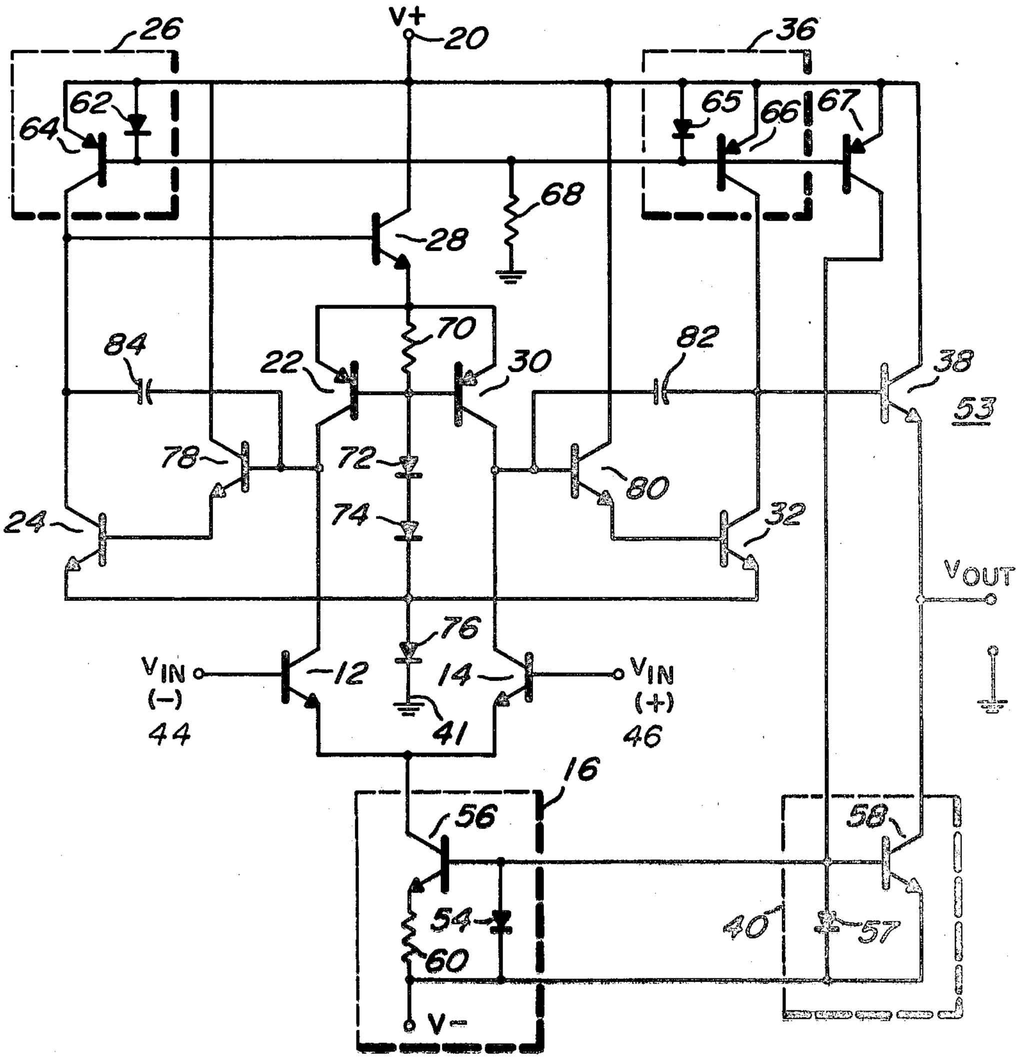
FIG. 2 is a schematic diagram of a direct-coupled amplifier having differential and balanced double-to-single ended converter stages.

FIG. 2 is a schematic diagram of amplifier 53 which in many respects is similar to D-C amplifier 10 of FIG. 1. Common reference numerals are employed in FIGS. 1 and 2 where appropriate. In FIG. 2, current supplies 16, 26, 36 and 40 are each shown as including a transistor having a diode connected between its base and emitter electrodes so that the transistor can supply no more than a maximum amount of current. Diode 54 of current supply 16 provides a constant base-to-emitter voltage for transistor 56 of current supply 16 and diode 57 provides a constant base-to-emitter voltage for transistor 58 of current supply 40. Resistor 60 is connected to the emitter of transistor 56 and causes current supply 16 to conduct less current than current supply 40. Also, diode 62 is connected between the base and emitter electrodes of transistor 64 and diode 65 is connected between the base and emitter electrode of transistor 66 to control the base-to-emitter voltages thereof and hence limit the amount of current supplied out the collectors of transistors 64 and 66. Transistor 67 responds to the constant voltage developed across diodes 62 and 65 to provide a limited current to the base of transistor 58 and to diodes 54 and 57. Resistor 68 provides the ground return path for the base current of transistors 64, 66 and 67 and sets the current level for diodes 62 and 65.

Resistor 70 is connected between the emitters of transistors 22, 28 and 30 and the bases of transistors 22 and 30. Series connected diodes 72 and 74 are connected from the bases of transistors 22 and 30 to the emitters of transistors 24 and 32. Diode 76 is connected between the emitters of transistors 24 and 32 and reference terminal 41. Diodes 72, 74, and 76 provide a low impedance path for the base currents of transistors 22 and 30. Thus, as the frequency of the input signal increases to the point where the betas of transistors 22 and 30 decrease, diodes 72, 74 and 76 provide a low impedance path for the increased base current to facilitate high frequency amplification.

Transistor 78 of circuit 53 is connected between transistors 22 and 24 of the configuration of amplifier 10. Transistor 78 has a collector electrode connected to positive supply 20, an emitter electrode connected to the base of transistor 24, and a base electrode connected to the collector of transistor 22. Similarly, transistor 80 is connected between transistors 30 and 32 of amplifier 53. Transistor 80 has a collector electrode connected to positive supply terminal 20, an emitter electrode connected to the base of transistor 32, and a base electrode connected to the collector of transistor 14. Transistors 78 and 80 provide additional current gain to preserve D.C. balance. Current source 16 draws a small value of current on the order of 2 microamps. Capacitor 82 is connected from the base of transistor 80 to the collector of transistor 32 and capacitor 84 is connected from the base of transistor 78 to the collector of transistor 24. These capacitors which are multiplied in effective value by the well-known Miller effect, increase the phase margin of the amplifier of circuit 53.

Amplifier 53 operates in a manner similar to the already described operation of amplifier 10 of FIG. 1.

Bias resistor 70 and diodes 72, 74 and 76 provide the bias voltage so that an external bias voltage need not be applied. Transistors 78 and 80 respectively amplify the currents at the collectors of transistors 12 and 14 and apply them to the bases of transistors 24 and 32. Common collector transistors 78 and 80 increase the current gain of amplifier 53 with respect to the gain of amplifier 10 so that less current is required from the driving source connected between terminals 44 and 46. As a result, the driving source resistance voltage drop does not adversely affect the amplification of the input voltage. Thus, amplifiers 10 and 53 are suitable for precision amplification of D.C. voltage components as is required, for instance, in a digital volt meter employing dual ramp analog-to-digital conversion.

What has been described, therefore, is an improved double-to-single ended converter which is suitable for being provided in monolithic, integrated circuit form. The double-to-single ended converter provides a balanced load to the collectors of the transistors of the differential amplifier. Thus, changes in supply voltage magnitude and temperature induced changes in the active load portions forming the converter tend to equally affect the collector voltages of the differential transistors and thus are eliminated by the common mode rejection capability inherent in the differential amplifier and the action of the converter circuit. Consequently, the input-offset voltage and current tend to be substantially independent of temperature. For instance, the configuration of FIG. 2 provided in monolithic form has an input offset voltage on the order of less than a 0.5 millivolt and a drift of less than 1 microvolt per degree C.

The amplifier configurations of FIG. 2 also has a voltage gain on the order of 100,000 and a unity gain cut off frequency of 1 megahertz. Frequency compensation capacitors 82 and 84 can be on the order of 5 picofarads because the converter circuit configuration utilizes the Miller effect to boost the equivalent capacitance. Thus, the converter circuit configurations of FIGS. 1 and 2 are capable of providing a single ended output voltage without upsetting the common mode rejection capability inherent in a balanced signal source such as a differential amplifier. Although the converter circuit has been described as being connected to a differential amplifier, it can be used to convert the balanced outputs of other types of balanced sources into an unbalanced output signal.

I claim:

1. In a circuit having a balanced signal source providing a balanced signal between first and second electrodes thereof, a balanced-to-unbalanced converter suitable for transforming the balanced signal into an unbalanced signal at an output terminal thereof and for applying substantially the same active loads to the first and second electrodes of the balanced signal source, the balanced-to-unbalanced converter including in combination:

power supply connecting means for providing voltage potentials, said power supply connecting means having an output terminal and a reference terminal;

first active load means for providing an active load to the first electrode of the balanced signal source, said first active load means having a first terminal coupled to the first electrode of the balanced signal source, a second terminal coupled to said output terminal of said power supply connecting means, a third terminal coupled to said reference terminal of said power supply connecting means, and an output terminal, said first active load means being responsive to said voltage potentials to provide an active impedance having first predetermined electrical characteristics to the first electrode of the balanced signal source; and second active load means for providing an active load to the second electrode of the balanced signal source, said second active load means having a first terminal coupled to the second electrode of the balanced signal source, a second terminal coupled to said output terminal of said power supply connecting means, a third terminal coupled to said reference terminal of said power supply connecting means, a fourth terminal coupled to said output terminal of said first active load means, and a fifth terminal providing the output terminal of the balanced-to-unbalanced converter, said second active load means being responsive to said voltage potentials to provide an active impedance having second predetermined electrical characteristics to the second electrode of the balanced signal source, said second predetermined electrical characteristics being substantially the same as said first predetermined electrical characteristics of said first active load means to cause substantially equal active impedances to be applied to the first and second electrodes of the balanced signal source.

2. The combination of claim 1 wherein:

said first active load means is responsive to an increase in signal amplitude at the first electrode of the balanced signal source to cause the output signal amplitude to change in a first direction; and said second active load means is responsive to a decrease in the signal amplitude at the second electrode of the balanced signal source to cause the output signal amplitude to also change in the first direction.

3. The combination of claim 1 wherein said first active load means includes:

current supply means for providing a constant current, said current supply means having first and second terminals, said first terminal being connected to said output terminal of said power supply connecting means; and first electron control means having a first electrode connected to said reference terminal of said power supply connecting means, a control electrode connected to the first electrode of the balanced signal source, and a second electrode connected to said second terminal of said current supply means, said first electron control means clamping the first electrode of the balanced signal source to a predetermined voltage having a fixed relationship with respect to the potential at said reference terminal of said power supply connecting means.

4. The combination of claim 3 wherein:

said first electron control means is a bipolar transistor of a first conductivity type having emitter, base, and collector electrodes corresponding respectively to said first, control and second electrodes; and said bipolar transistor having a base-to-emitter junction for clamping the first electrode of the balanced signal source to said predetermined voltage which is a substantially fixed amount greater than said potential at said reference terminal of said power supply connecting means.

5. The combination of claim 3 wherein said first active load means further includes:

second electron control means having a first electrode connected to said output terminal of said first active load means, a second electrode connected to said output terminal of said power supply connecting means and a control electrode connected to said second terminal of said current supply means and to said second electrode of said first electron control means; and third electron control means having a first electrode connected to said first electrode of said second electron control means, and a second electrode connected to the first electrode of the balanced signal source.

6. The combination of claim 1 wherein said second active load means includes:

current supply means for supplying a constant current, said current supply means having first and second terminals, said first terminal being connected to said output terminal of said power supply connecting means; and electron control means having a first electrode connected to said reference terminal of said power supply connecting means, a control electrode connected to the second electrode of the balanced signal source and a second electrode connected to said second terminal of said current supply means, said electron control means clamping the second electrode of the balanced signal source to a predetermined voltage having a fixed relationship with respect to said potential at said reference terminal of said power supply connecting means.

7. The combination of claim 6 wherein:

said electron control means is a bipolar transistor of a first conductivity type having emitter, base and collector electrodes corresponding respectively to said first, control and second electrodes of said electron control means; and said bipolar transistor having a base-to-emitter junction for clamping the second electrode of the balanced signal source to said predetermined voltage which is a substantially fixed amount greater than said potential at said reference terminal of said power supply connecting means.

8. A double-to-single ended converter circuit suitable for being connected to first and second output terminals of a differential amplifier, the converter transforming the balanced signal occurring at the output terminals of the differential amplifier into an unbalanced signal at an output terminal thereof and including in combination:

first power supply connecting means for supplying a voltage of a first magnitude between an output terminal and a reference terminal thereof;

second power supply connecting means for supplying a bias voltage between an output terminal and said reference terminal, first current supply means having a power terminal connected to said output terminal of said first power supply connecting means and having an output terminal;

second current supply means having a power terminal connected to said output terminal of said first power supply connecting means and having an output terminal;

first electron control means having a first electrode, a second electrode connected to said output terminal of said first power supply connecting means and a control electrode connected to said output terminal of said first current supply means;

second electron control means having a first electrode connected to said first electrode of said first electron control means, a second electrode, and a control electrode connected to said output terminal of said second power supply connecting means;

third electron control means having a first electrode connected to said first electrode of said first electron control means and to said first electrode of said second electron control means, a second electrode, and a control electrode connected to said control electrode of said second electron control means and to said output terminal of said second power supply connecting means;

fourth electron control means having a first electrode coupled to said reference terminal of said first power supply connecting means, a second electrode connected to said output terminal of said first current supply means and to said control electrode of said first electron control means, and a control electrode connected to the first output terminal of the differential amplifier and coupled to said second electrode of said second electron control means; and fifth electron control means having a first electrode coupled to said reference terminal of said first power supply connecting means, a second electrode connected to said output terminal of said second current supply means, said second electrode of said fifth electron control means providing an output terminal for the converter, and a control electrode connected to the second output terminal of the differential amplifier and coupled to said second electrode of said third electron control means.

9. The converter circuit of claim 8 further including:

sixth electron control means having a first electrode, a second electrode connected to said output terminal of said first power supply connecting means and a control electrode connected to said output terminal of said second current supply means and to said second electrode of said fifth electron control means; and third current supply means having a terminal connected to said reference terminal of said first power supply connecting means and a second terminal connected to said first electrode of said sixth electron control means.

10. The converter circuit of claim 8 further including:

another electron control means having a first electrode connected to said control electrode of said fourth electron control means, a control electrode connected to said second electrode of said second electron control means, and a second electrode connected to said output terminal of said first power supply connecting means.

11. The converter circuit of claim 8 further including:

further electron control means having a first electrode connected to said control electrode of said fifth electron control means, a second electrode connected to said output terminal of said first power supply connecting means, and a control electrode connected to said second electrode of said third electron control means.

12. The converter circuit of claim 8 wherein said first, fourth and fifth electron control means are transistors of a first conductivity type, and said second and third electron control means are transistors of a second conductivity type.

13. The converter circuit of claim 8 wherein at least one of said current supply means includes:

a bipolar transistor having an emitter electrode connected to one of said terminals of said first power supply connecting means, a collector electrode connected to said output terminal of said at least one of said current supply means, and a base electrode; and a diode connected between said base and emitter electrodes of said bipolar transistor to control the base-to-emitter voltage thereof to thereby control the collector current of said bipolar transistor which is provided at said output terminal of said at least one of said current supply means.

14. The converter circuit of claim 9 wherein said sixth electron control means is a transistor of the first conductivity type.

15. The converter circuit of claim 12 wherein said transistors of said first conductivity type are NPN bipolar transistors and said transistors of said second conductivity type are PNP bipolar transistors.

16. The converter circuit of claim 15 wherein said first, second and control electrodes of said electron control means respectively correspond to emitter, collector and base electrodes of said bipolar transistors.

17. The converter circuit of claim 10 further including capacitive means coupling said control electrode of said another electron control means to said second electrode of said fourth electron control means.

18. The converter circuit of claim 11 further including capacitive means coupling said control electrode of said further electron control means to said second electrode of said fifth electron control means.

19. In a circuit having a balanced signal source providing a balanced signal between first and second output terminals thereof, a balanced-to-unbalanced converter suitable for transforming the balanced signal into an unbalanced signal at an output terminal thereof and for applying substantially equal quiescent voltages and currents to the first and second output terminals of the balanced signal source, the balanced-to-unbalanced converter including in combination:

differential amplifier means for amplifying said balanced signal, said differential amplifier means having first and second output terminals, a first input terminal coupled to the first output terminal of the balanced signal source and a second input terminal coupled to the second output terminal of the balanced signal source;

power supply connecting means for providing voltages, said power supply connecting means having an output terminal, a bias terminal, and a reference terminal;

first active load means for said first output terminal of said differential amplifier means, said first active load means having a first terminal coupled to said first output terminal of said differential amplifier means, a second terminal coupled to said output terminal of said power supply connecting means, a third terminal connected to said reference terminal of said power supply connecting means, a bias electrode connected to said bias terminal of said power supply connecting means, and an output terminal, said first active load means applying a predetermined voltage and current to said first output terminal of said differential amplifier means during quiescent operation; and second active load means for said second output terminal of said differential amplifier means, said second active load means having a first terminal coupled to said second output terminal of said differential amplifier means, a second terminal coupled to said output terminal of said power supply connecting means, a third terminal coupled to said reference terminal of said power supply connecting means, a fourth terminal coupled to said output terminal of said first active load means, a bias electrode connected to said bias terminal of said power supply connecting means and a fifth terminal connected to the output terminal of the balanced-to-unbalanced converter, said second active load means applying a voltage and current which are substantially equal to said predetermined voltage and current to said second output terminal of said differential amplifier means during quiescent operation.

* * * * *